United States Patent
Ibusuki et al.

(10) Patent No.: US 9,762,187 B2
(45) Date of Patent: Sep. 12, 2017

(54) AUDIO OUTPUT CIRCUIT FOR DRIVING AN ELECTROACOUSTIC CONVERSION ELEMENT

(71) Applicant: ROHM CO., LTD., Ukyo-Ku, Kyoto (JP)

(72) Inventors: Takayuki Ibusuki, Kyoto (JP); Naotaka Saito, Kyoto (JP); Hideo Araki, Kyoto (JP)

(73) Assignee: ROHM CO., LTD., Ukyo-Ku, Kyoto (JP)

( * ) Notice: Subject to any disclaimer, the term of this patent is extended or adjusted under 35 U.S.C. 154(b) by 0 days.

(21) Appl. No.: 14/671,096

(22) Filed: Mar. 27, 2015

(65) Prior Publication Data
US 2015/0281831 A1   Oct. 1, 2015

(30) Foreign Application Priority Data
Apr. 1, 2014   (JP) ................. 2014-075758

(51) Int. Cl.
| | |
|---|---|
| H04R 1/10 | (2006.01) |
| H03F 3/183 | (2006.01) |
| H03F 3/217 | (2006.01) |
| H04R 3/00 | (2006.01) |
| H03F 3/185 | (2006.01) |

(52) U.S. Cl.
CPC ............. *H03F 3/183* (2013.01); *H03F 3/185* (2013.01); *H03F 3/2173* (2013.01); *H04R 3/00* (2013.01); *H03F 2200/03* (2013.01); *H03F 2200/129* (2013.01); *H03F 2200/351* (2013.01); *H04R 1/1008* (2013.01); *H04R 2430/01* (2013.01)

(58) Field of Classification Search
CPC ...... H03F 3/217; H03F 3/2171; H03F 3/2173; H03F 3/2178; H03F 2200/03; H03F 2200/351; H04R 2430/01; H03G 1/0088; H03G 1/0094; H03G 3/008; H03G 3/3026; H03G 3/3031; H03G 3/32; H03G 3/34; H03G 2201/504; H03G 2201/506
See application file for complete search history.

(56) References Cited

U.S. PATENT DOCUMENTS

| | | | | |
|---|---|---|---|---|
| 7,852,156 B1* | 12/2010 | Chen | ................... | H03F 3/2173 330/10 |
| 8,093,951 B1* | 1/2012 | Zhang | ................... | H03F 3/217 330/251 |
| 2002/0153947 A1* | 10/2002 | Andersson | ............ | H03F 3/2171 330/10 |
| 2005/0083114 A1* | 4/2005 | Risbo | ..................... | H03F 3/217 330/10 |
| 2012/0182069 A1* | 7/2012 | Stanley | ........... | H01L 21/823892 330/251 |

FOREIGN PATENT DOCUMENTS

| | | |
|---|---|---|
| JP | 2001223537 A | 8/2001 |
| JP | 2013187861 A | 9/2013 |

* cited by examiner

*Primary Examiner* — Mark Fischer
(74) *Attorney, Agent, or Firm* — Cantor Colburn LLP

(57) ABSTRACT

An audio output circuit drives an electroacoustic conversion element. A Class D amplifier has a segmented configuration including multiple segments arranged in parallel. A pulse modulator pulse modulates an audio signal. A level detector detects the amplitude of the audio signal. A driver selectively drives the multiple segments of the Class D amplifier according to the output of the level detector.

17 Claims, 8 Drawing Sheets

AUDIO OUTPUT CIRCUIT FOR DRIVING AN ELECTROACOUSTIC CONVERSION ELEMENT

CROSS REFERENCE TO RELATED APPLICATIONS

The present invention claims priority under 35 U.S.C. §119 to Japanese Application No. 2014-075758 filed Apr. 1, 2014, the entire content of which is incorporated herein by reference.

BACKGROUND OF THE INVENTION

Field of the Invention

The present invention relates to an audio output circuit that drives a speaker or headphones.

Description of the Related Art

An audio output circuit is employed in order to amplify a weak audio signal so as to drive an electroacoustic conversion element such as a speaker, headphones, or the like. FIG. 1 is a circuit diagram showing a configuration of an audio output circuit 100r including a Class D amplifier. The audio output circuit 100r includes a Class D amplifier 10, a driver 20, a pulse modulator 30, and an amplifier 40. The amplifier 40 amplifies an input audio signal $S_{IN}$. The pulse modulator 30 generates a pulse signal S2 that is pulse modulated so as to have a duty ratio that corresponds to the audio signal S1 amplified by the amplifier 40. The driver 20 drives the Class D amplifier 10 according to the pulse signal S2.

A high-side transistor MH and a low-side transistor ML of the Class D amplifier 10 switch on and off in a complementary manner so as to output, via an output terminal OUT, a driving voltage $S_{OUT}$ that switches between a power supply voltage $V_{DD}$ and a ground voltage $V_{GND}$. The driving voltage $S_{OUT}$ is input to an electroacoustic conversion element 102 via a filter 104.

The present inventors have investigated the efficiency of the audio output circuit 100r shown in FIG. 1, and have come to recognize the following problems.

The efficiency η of the Class D amplifier is represented by the following Expression.

$$\eta = P_{OUT}/P_{IN}$$

Here, $P_{OUT}$ represents electric power supplied to the electroacoustic conversion element 102 that functions as a load, and $P_{IN}$ represents electric power input to the audio output circuit 100. $P_{IN}$ is represented by the following Expression.

$$P_{IN} = P_{SW} + P_{SHT} + P_{ON} + P_{OUT}$$

Here, $P_{SW}$ represents switching loss, $P_{SHT}$ represents short-through loss, and $P_{ON}$ represents loss due to on resistance.

The switching loss $P_{SW}$ is electric power required to switch on and off the high-side transistor MH and the low-side transistor ML of the Class D amplifier 10. Specifically, the switching loss represents electric power required to charge and discharge the gate capacitance $C_G$. Thus, as the gate capacitance $C_G$ becomes larger, i.e., as the transistor size becomes larger, the switching loss $P_{SW}$ becomes more dominant.

In such an audio output circuit 100r, the transistor size of the Class D amplifier is determined so as to provide favorable distortion characteristics in its maximum output operation. The switching loss $P_{SW}$ is constant regardless of the magnitude of the output power $P_{OUT}$ of the Class D amplifier. Accordingly, in a small $P_{OUT}$ range, the ratio of $P_{SW}$ with respect to $P_{IN}$ is dominant. Thus, in this range, such an arrangement has a problem of reduced efficiency.

It is rare for such an audio output circuit 100r to be used at its maximum output level. In actual use, such an audio output circuit 100r is used in its medium to lower range. Alternatively, if the time period of a silent state becomes long, improvement of the efficiency η in the low output state is effective for reducing power consumption.

SUMMARY OF THE INVENTION

The present invention has been made in order to solve such a problem. Accordingly, it is an exemplary purpose of the present invention to provide an audio output circuit having favorable distortion characteristics and high efficiency.

An embodiment of the present invention relates to an audio output circuit that drives an electroacoustic conversion element. The audio output circuit comprises: a Class D amplifier configured including multiple segments connected in parallel; a pulse modulator that pulse modulates an audio signal; a level detector that detects an amplitude of the audio signal; and a driver that selectively drives the multiple segments of the Class D amplifier according to an output of the level detector.

With such an embodiment, the number of enabled segments is reduced in the low output operation, thereby reducing the gate capacity. This allows the switching loss to be reduced. As a result, such an arrangement provides improved efficiency in the low output operation. On the other hand, in a high output operation, the number of enabled segments of the class D amplifier is increased. In this case, the current capacity is increased, thereby providing favorable distortion characteristics.

Also, the level detector may detect the amplitude of the audio signal based on an input signal of the pulse modulator.

Also, the level detector may detect the amplitude of the audio signal based on an output signal of the Class D amplifier.

Also, the level detector may detect the amplitude of the audio signal based on an input signal of the electroacoustic conversion element.

Also, the driver may include multiple sub-drivers that are respectively associated with the multiple segments. Also the sub-drivers may each be configured to switch between an enable state in which a corresponding segment is driven and a disable state in which a driving operation for the corresponding segment is suspended. Also, the number of sub-drivers to be set to the enable state may be switchable according to the output of the level detector.

Also, the audio output circuit according to an embodiment may further comprise a volume circuit that changes the amplitude of the audio signal according to a volume setting value.

Also, the audio output circuit according to an embodiment may comprise two sets, each comprising the Class D amplifier and the driver, that operate in opposite polarity modes, so as to BTL (Bridged Transless) drive the electroacoustic conversion element.

Also, the audio output circuit may be monolithically integrated on a single semiconductor substrate.

Examples of such a "monolithically integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants.

By monolithically integrating the circuit as a single IC, such an arrangement allows the circuit area to be reduced, and allows the circuit elements to have uniform characteristics.

Another embodiment of the present invention relates to an electronic device. The electronic device comprises: an electroacoustic conversion element having a negative terminal that is grounded; any one of the aforementioned audio output circuits; a first capacitor configured such that one end thereof is connected to a positive electrode of the electroacoustic conversion element and the other end thereof is grounded; and a first inductor arranged such that one end thereof is connected to the positive electrode of the electroacoustic conversion element and the other end thereof is connected to an output terminal of the driver of the audio output circuit.

yet another embodiment of the present invention also relates to an electronic device. The electronic device comprises: an electroacoustic conversion element; any one of the aforementioned audio output circuits; a first capacitor arranged such that one end thereof is connected to a positive electrode of the electroacoustic conversion element and the other end thereof is grounded; a second capacitor arranged such that one end thereof is connected to a negative electrode of the electroacoustic conversion element and the other end thereof is grounded; a first inductor arranged such that one end thereof is connected to the positive electrode of the electroacoustic conversion element and the other end thereof is connected to an output terminal of one of the two drivers of the audio output circuit; and a second inductor arranged such that one end thereof is connected to the negative electrode of the electroacoustic conversion element and the other end thereof is connected to an output terminal of the other one of the two drivers of the audio output circuit.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
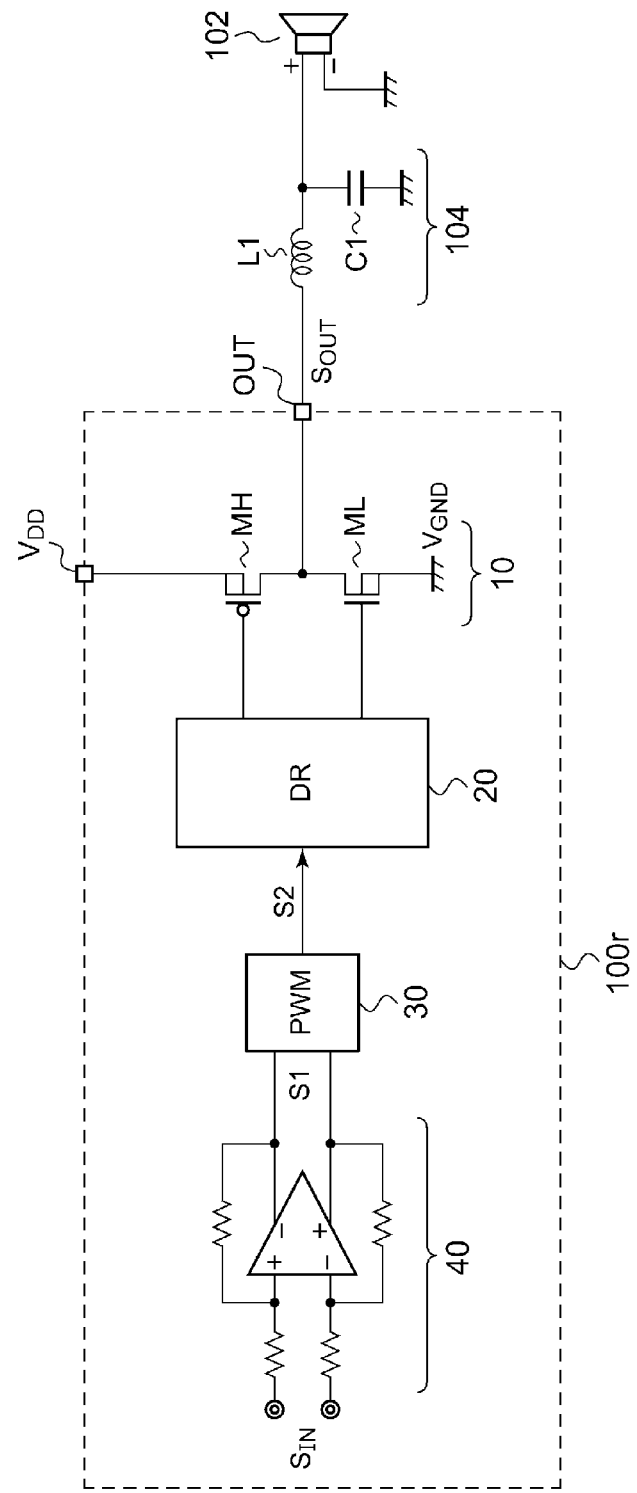
FIG. 1 is a circuit diagram showing a configuration of an audio output circuit including a class D amplifier.
Figure 2:
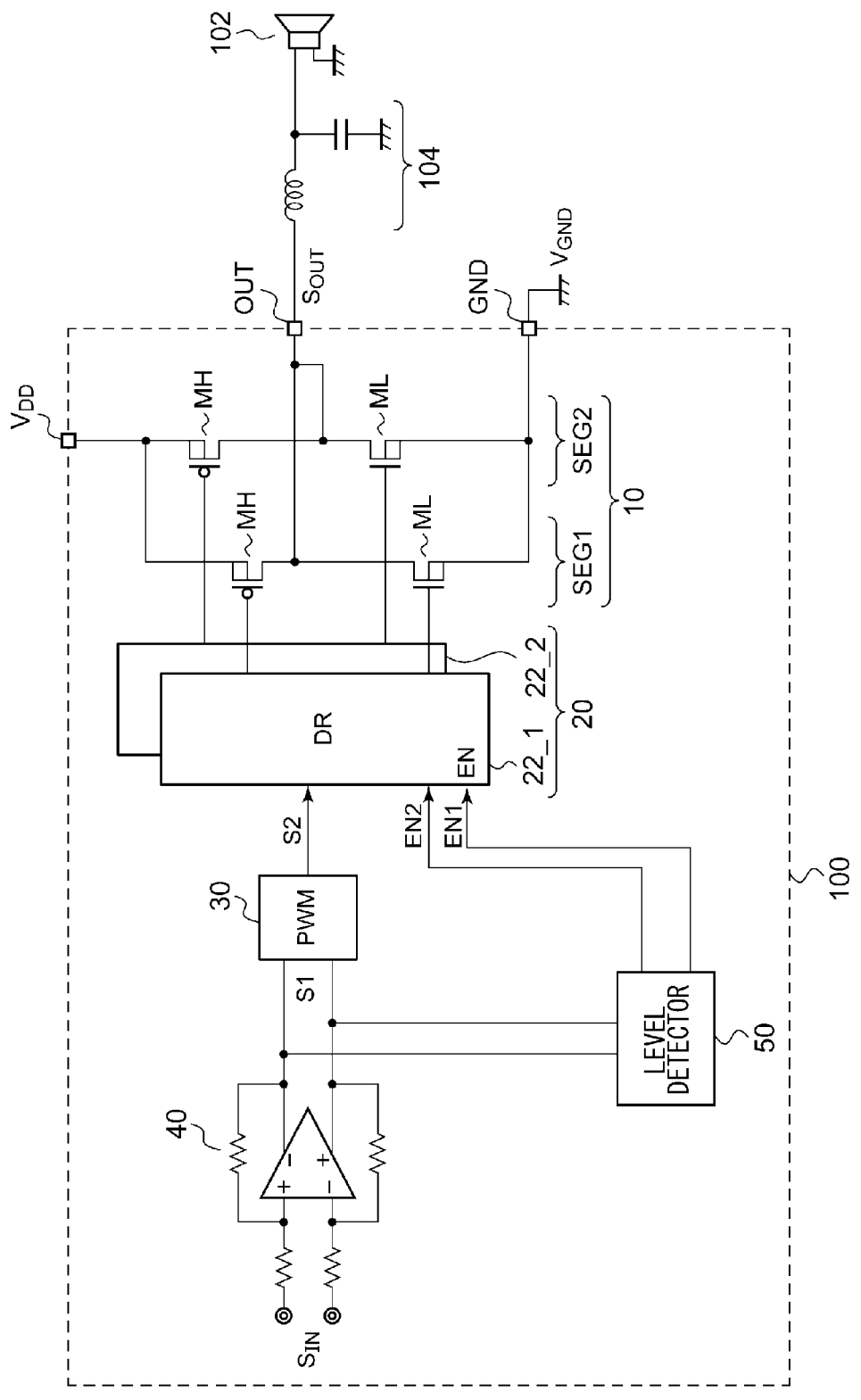
FIG. 2 is a circuit diagram showing an audio output circuit according to an embodiment.

FIG. 2 is a circuit diagram showing an audio output circuit 100 according to an embodiment. The audio output circuit 100 includes a Class D amplifier 10, a driver 20, a pulse modulator 30, an amplifier 40, and a level detector 50, and is configured as a function IC (Integrated Circuit) monolithically integrated on a semiconductor substrate. The audio output circuit 100 is configured as a so-called switching amplifier, and drives a speaker 102 configured as an electroacoustic conversion element according to an audio signal. Headphones may be driven instead of the speaker 102.

The Class D amplifier 10 has a segmented configuration comprising multiple (N equal to or greater than 2) segments SEG connected in parallel. Description will be made in the present embodiment in which N=2. However, the number of segments is not restricted in particular.

The amplifier 40 amplifies the audio signal $S_{IN}$. For example, the amplifier 40 is configured as a volume circuit having a variable gain that is changed according to a volume value set by the user. FIG. 2 shows an arrangement configured to receive an audio signal $S_{IN}$ in the form of a differential signal. Also, the audio signal $S_{IN}$ may be configured as a single-ended signal.

The pulse modulator 30 pulse modulates the audio signal S1. For example, the pulse modulator 30 is configured as a pulse width modulator, which generates a pulse signal S2 having a predetermined frequency and a pulse width, i.e., a duty ratio, that corresponds to the audio signal S1. The pulse modulator 30 may be configured as an analog pulse width modulator that slices a triangle waveform signal or otherwise a sawtooth waveform signal at the level of the audio signal S1. Also, the pulse modulator 30 may be configured as a digital pulse width modulator. Also, the pulse modulator 30 may perform delta-sigma modulation or the like instead of the pulse width modulation.

The level detector 50 detects the amplitude of the audio signal to be played back. In the present embodiment, the level detector 50 detects the amplitude level of the audio signal S1 which is the output of the amplifier 40 and the input of the pulse modulator 30.

The driver 20 selectively drives the multiple segments SEG1 and SEG2 of the Class D amplifier 10 according to the output of the level detector 50. That is to say, when the amplitude level detected by the level detector 50 is greater than a predetermined threshold value, the driver 20 drives both the two segments SEG1 and SEG2. When the amplitude level detected by the level detector 50 is smaller than the threshold value, the driver 20 drives only one segment, i.e., only the segment SEG1.

The driver 20 includes multiple sub-drivers 22. The multiple sub-drivers 22 are respectively associated with the multiple segments SEG. The sub-drivers 22 are each configured to switch between an enable state and a disable state. In the enable state, the i-th sub-driver 22 drives the corresponding segment SEGi. In the disable state, the i-th sub-driver 22 suspends the switching operation of the corresponding segment SEGi. The driver 20 is configured to be capable of switching the number of enabled sub-drivers 22 according to the output of the level detector 50.

For example, each sub-driver 22 may include an enable terminal EN that receives an enable signal from the level detector 50, and may be configured to switch to the enable state when a high-level signal is input to the enable terminal EN, and to switch to the disable state when a low-level signal is input to the enable terminal EN. When the amplitude level of the audio signal is greater than the threshold value, both the enable signals EN1 and EN2 may be set to high level. When the amplitude level of the audio signal is smaller than the threshold value, one enable signal EN may be set to low level and the other enable signal may be set to high level.

It should be noted that the method for selectively switching on and off the multiple sub-drivers 22 is not restricted to such an arrangement.

The above is the configuration of the audio output circuit 100. Next, description will be made regarding the operation thereof.

Figure 3:
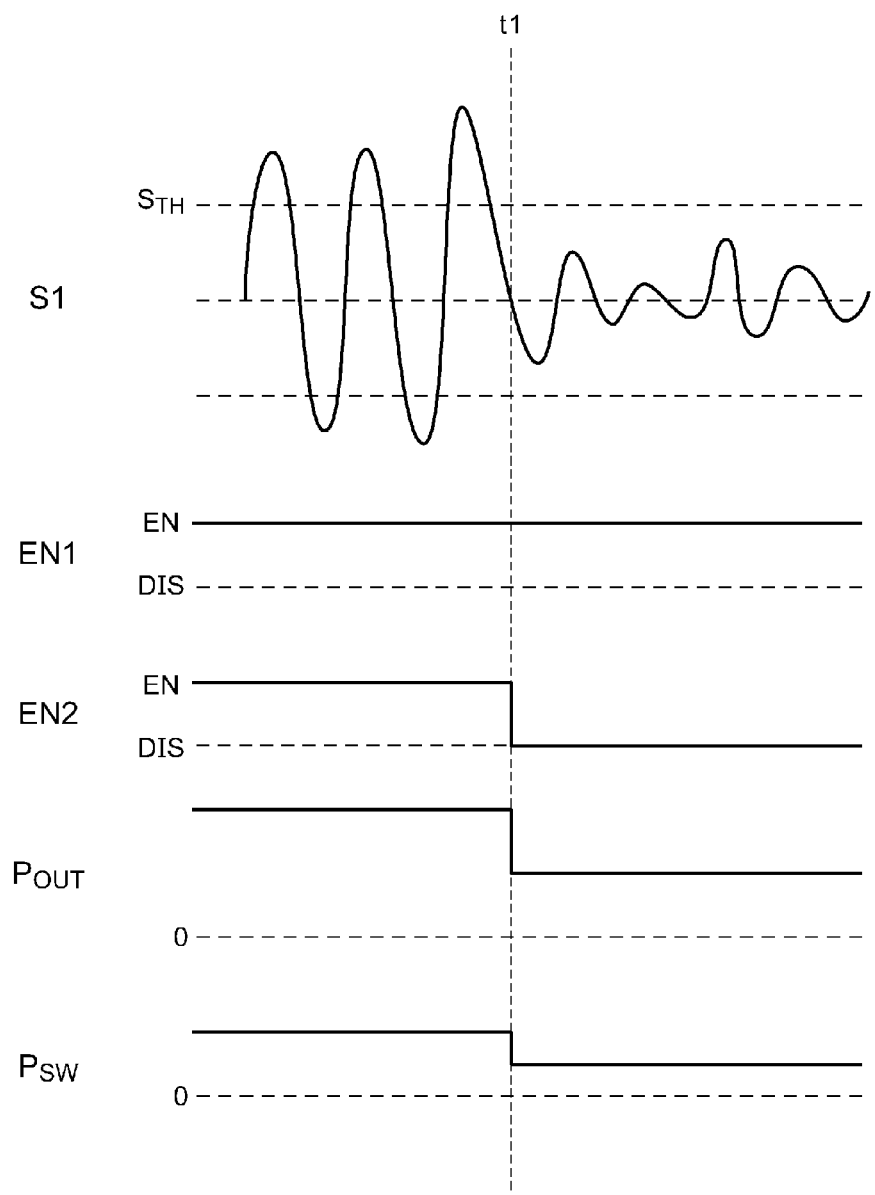
FIG. 3 is an operation waveform diagram showing the operation of the audio output circuit shown in FIG. 2.

FIG. 3 is an operation waveform diagram showing the operation of the audio output circuit 100 shown in FIG. 2.

Before the time point t1, the volume setting value is large, and the amplitude of the audio signal S1 is greater than the threshold value $S_{TH}$. In this state, the level detector 50 sets both the enable signals EN1 and EN2 to high level so as to set the sub-drivers 22_1 and 22_2 to the enable state. In this state, the effective transistor size of the driver 20 is raised, which raises the current capacity. This provides a high-quality audio playback operation with low distortion.

After the time point t1, the volume setting value is reduced, and the amplitude of the audio signal S1 becomes smaller than the threshold value $S_{TH}$. In this state, the level detector 50 sets the enable signal EN1 to high level, and sets the enable signal EN2 to low level, so as to set only the sub-driver 22_1 to the enable state. In this state, the effective transistor size of the driver 20 is reduced, thereby reducing the switching loss $P_{SW}$. As a result, such an arrangement provides improved efficiency in a small-volume playback operation.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

First Modification

Figure 4:
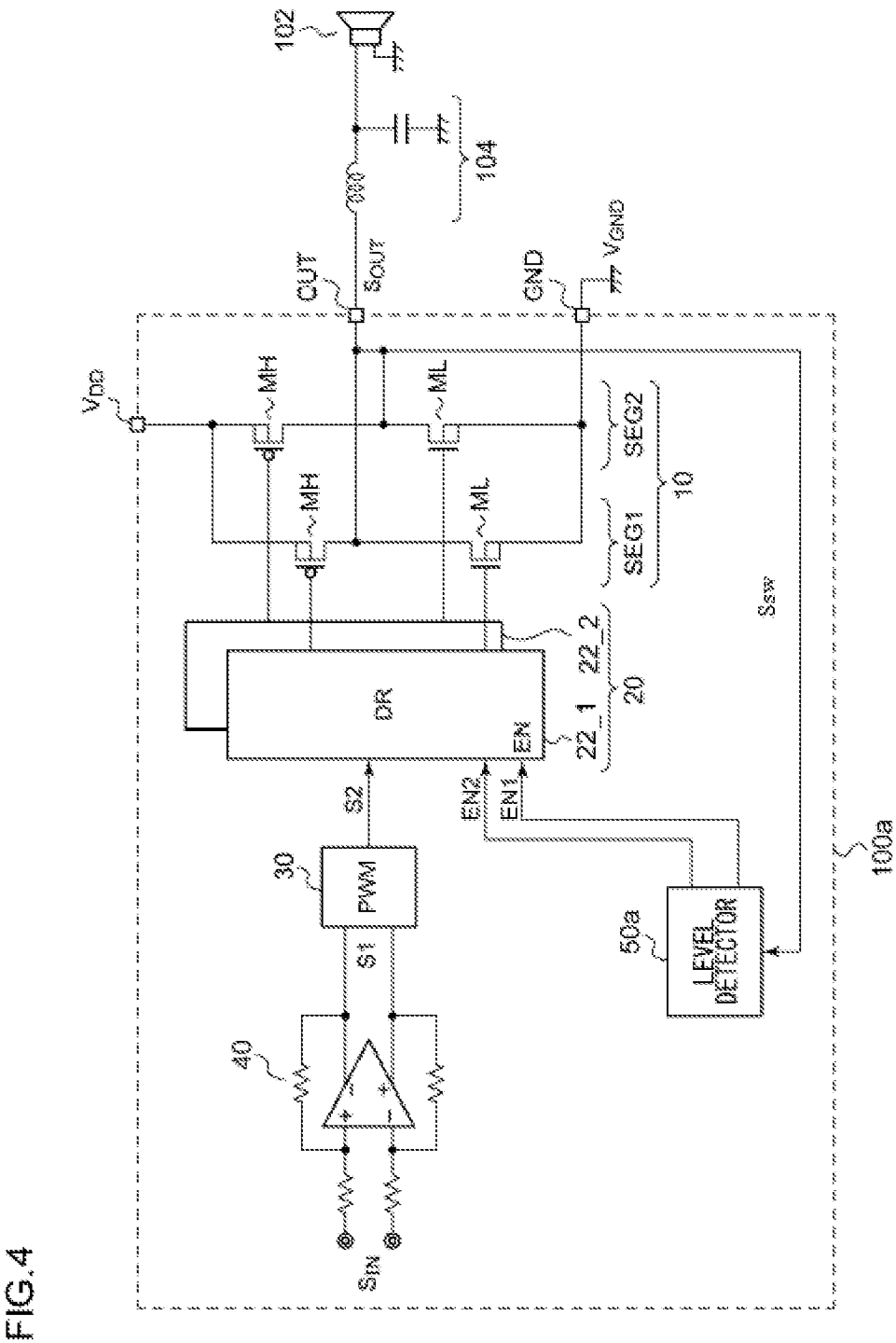
FIG. 4 is a circuit diagram showing an audio output circuit according to a first modification.

FIG. 4 is a circuit diagram showing an audio output circuit 100a according to a first modification. In this modification, a level detector 50a detects the amplitude of the audio signal based on the output signal $S_{SW}$ of the Class D amplifier 10. The output signal $S_{SW}$ is configured as a pulse-modulated signal. Thus, the duty ratio of the output signal $S_{SW}$ represents the amplitude of the audio signal S1. For example, the pulse detector 50a may include a low-pass filter that smoothes the pulse signal $S_{SW}$, and may detect the amplitude of the audio signal S1 based on the output of the low-pass filter.

Alternatively, the level detector 50a may detect the amplitude of the audio signal S1 based on the output S2 of the pulse modulator 30, or otherwise based on the respective gate driving signals for the high-side transistor MH and the low-side transistor ML.

Second Modification

Figure 5:
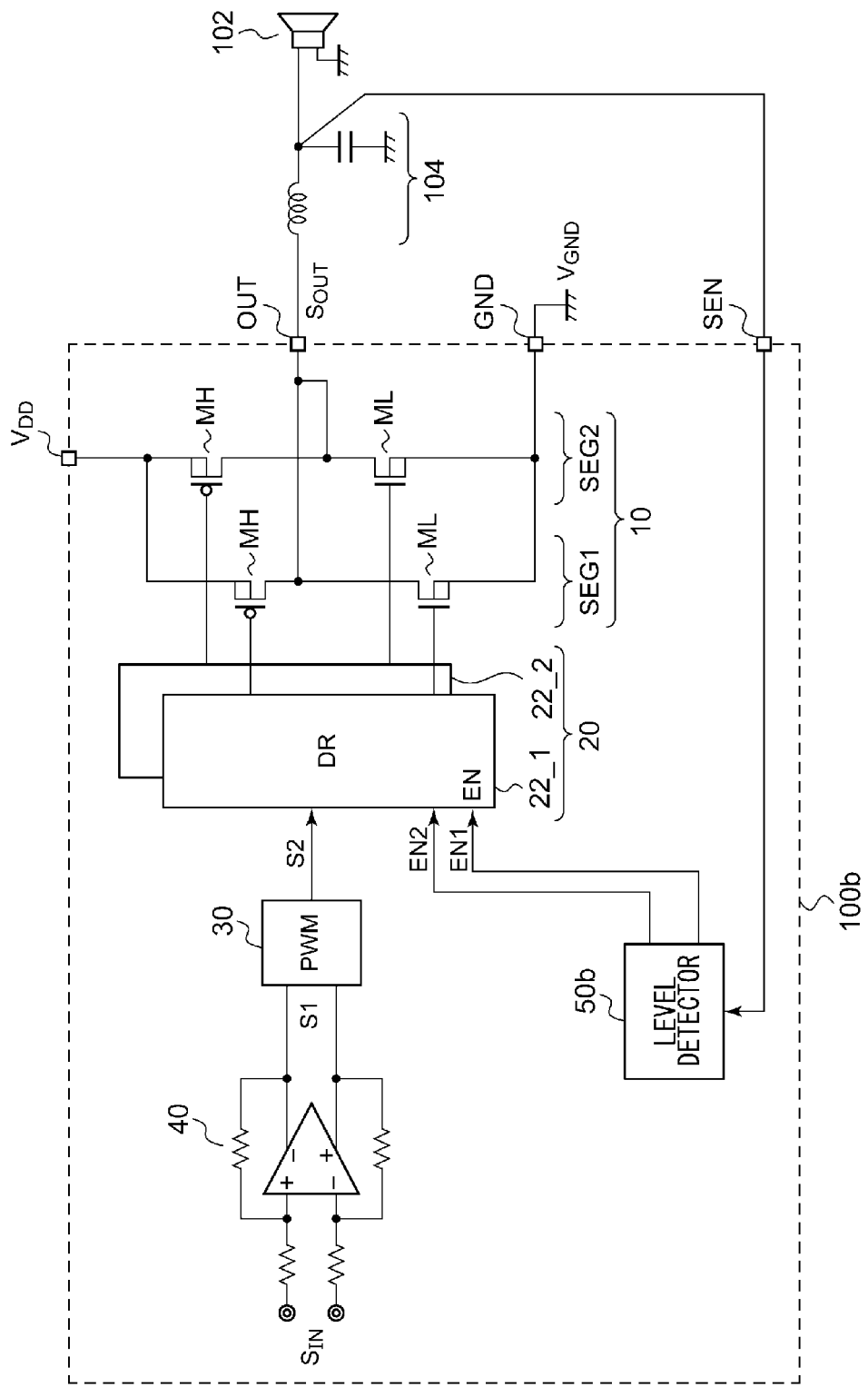
FIG. 5 is a circuit diagram showing an audio output circuit according to a second modification.

FIG. 5 is a circuit diagram showing an audio output circuit 100b according to a second modification.

A level detector 50b detects the amplitude of the audio signal S1 based on the input signal $S_{OUT}$ of the electroacoustic conversion element 102. Such a modification requires an additional terminal SEN for receiving the input signal $S_{OUT}$. However, the input signal of the electroacoustic conversion element 102 represents the amplitude of the audio signal in the playback operation with the highest precision. Thus, such an arrangement provides improved amplitude detection.

Third Modification

Figure 6:
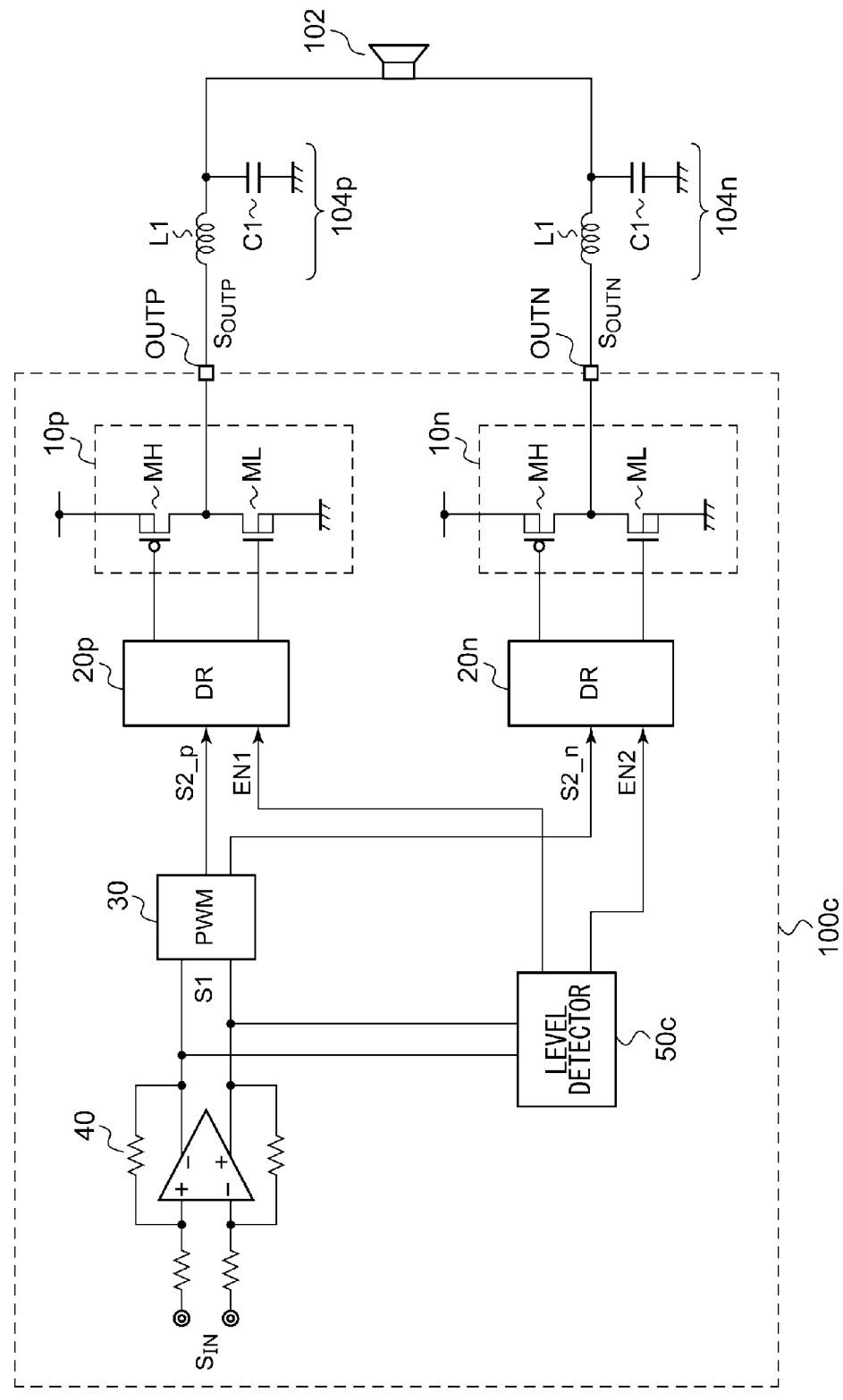
FIG. 6 is a circuit diagram showing an audio output circuit according to a third modification.

FIG. 6 is a circuit diagram showing an audio output circuit 100c according to a third modification. The audio output circuit 100c includes two sets each comprising a Class D amplifier 10 and a driver 20. The first set comprising the Class D amplifier 10p and the driver 20p and the second set comprising the Class D amplifier 10n and the driver 20n operate in opposite polarity modes, so as to BTL (Bridged Transless) drive the speaker 102. The Class D amplifiers 10p and 10n each have a segmented configuration comprising multiple segments SEG in the same manner as in the embodiment. The driver 20p is configured to selectively drive the multiple segments of the Class D amplifier 10p. The driver 20n is configured to selectively drive the multiple segments of the Class D amplifier 10n. A level detector 50c controls the number of segments to be enabled for each of the Class D amplifiers 10p and 10n. An inductor L1 of a filter 104p and an inductor L2 of a filter 104 may be configured as a common-mode choke coil.

Such a modification provides the same effects as those provided by the embodiment.

Fourth Modification

Description has been made in the embodiment regarding an arrangement in which the input signal S2 of the pulse modulator 30 is configured as an analog signal. Also, the input signal of the pulse modulator 30 may be configured as a digital audio signal.

[Usage]

Figure 7:
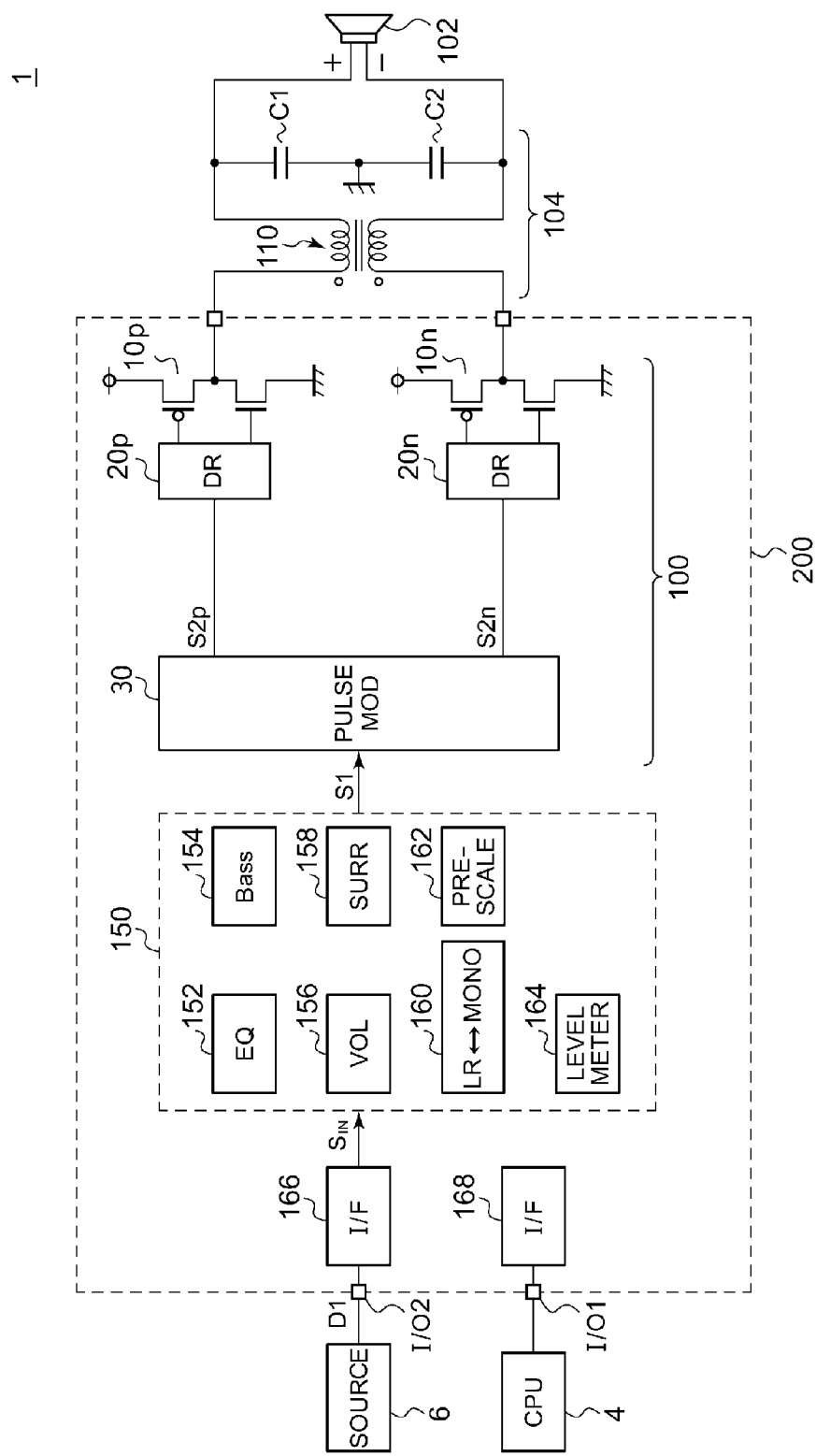
FIG. 7 is a circuit diagram showing an electronic device including an audio output circuit.

Lastly, description will be made regarding an application of the audio output circuit 100. FIG. 7 is a circuit diagram showing an electronic device 1 including the audio output circuit 100.

The electronic device 1 includes an audio IC 200, a speaker 102, a filter 104, a CPU 4, and a sound source 6. A common-mode choke coil 110 is employed in the filter 104. The speaker 102 is BTL driven. The audio output circuit 100 is configured to receive an input signal in a digital input manner.

The sound source 6 and the audio IC 200 are connected to each other in a wired manner such as an I$^2$S bus or the like, or otherwise in a wireless manner such as Bluetooth (Trademark) or the like. Furthermore, the CPU 4 is connected to the I/O terminal IO1 of the audio IC 200 via an I$^2$C bus or the like. The sound source 6 generates digital audio data D1.

The audio IC 200 further includes a DSP (Digital Sound Processor) 150 arranged in the upstream stage of the audio output circuit 100, and an audio interface circuit 166, in addition to the audio output circuit 100. The audio IC 200 is configured as a function IC monolithically integrated on a single semiconductor substrate. The audio interface circuit 166 receives the audio data D1 from the sound source 6, and outputs an audio signal $S_{IN}$ to the DSP 150.

The DSP 150 performs various kinds of signal processing for the audio signal $S_{IN}$. For example, the DSP 150 includes at least one of an equalizer 152, a bass booster circuit 154, a volume circuit 156, a surround circuit 158, a monaural/stereophonic converter circuit 160, a pre-scaler 162, and a level meter 164.

The equalizer 152 performs equalizing processing for the audio signal $S_{IN}$. The bass booster circuit 154 performs low-frequency enhancement processing for the audio signal $S_{IN}$. The volume circuit 156 adjusts the volume. The surround circuit 158 performs surround processing for the audio signal $S_{IN}$. The monaural/stereophonic converter circuit 160 performs monaural processing or stereophonic processing for the audio signal $S_{IN}$. The pre-scaler 162 performs frequency conversion for the audio signal $S_{IN}$. The level meter 164 detects the level of the audio signal S1. Each unit is configured to switch on and off individually. Also, the processing order may be set as desired. The level meter 164 may have the same function as that of the level detector 50 described in the embodiment.

A D/A converter may be arranged between the DSP 150 and the pulse modulator 30. In this case, the input signal of the audio output circuit 100 is configured as an analog signal.

An interface circuit 168 receives data such as a volume setting value or the like from the CPU 4. The operation parameters for the DSP 150 can be set via the CPU 4.

Figure 8A:
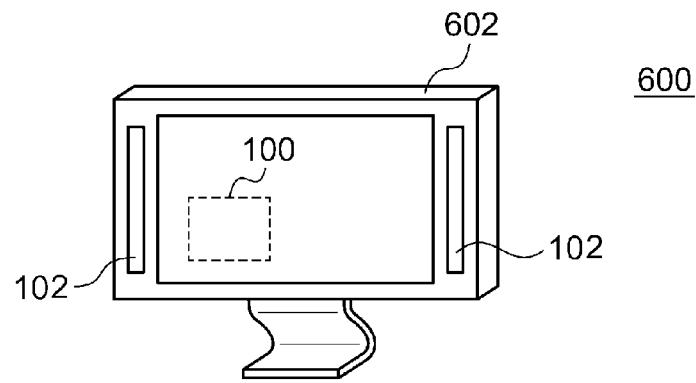
FIGS. 8A through 8C are external views each showing an electronic device.
Figure 8B:
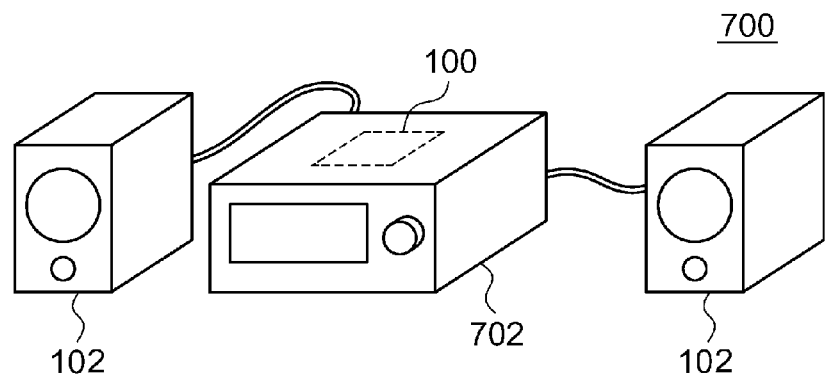
Figure 8C:
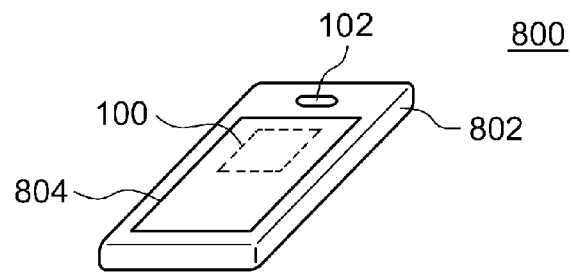

FIGS. 8A through 8C are external views each showing the electronic device 1. FIG. 8A shows a display device 600 as an example of the electronic device 1. The display device 600 includes a housing 602 and speakers 102. The audio output circuit 100 is built into the housing, and drives the speakers 102.

FIG. 8B shows an audio component stereo 700 as an example of the electronic device 1. The audio component stereo 700 includes a housing 702 and speakers 102. The audio output circuit 100 is built into the housing 702, and drives the speakers 102.

FIG. 8C shows a compact information terminal 800 as an example of the electronic device 1. The compact information terminal 800 is configured as a cellular phone, PHS (Personal Handy-phone System), PDA (Personal Digital Assistant), tablet PC (Personal Computer), audio player, or the like. The compact information terminal 800 includes a housing 802, a speaker 102, and a display 804. The audio output circuit 100 is built into the housing 802, and drives the speaker 102.

While the preferred embodiments of the present invention have been described using specific terms, such description is for illustrative purposes only, and it is to be understood that changes and variations may be made without departing from the spirit or scope of the appended claims.

What is claimed is:

1. An audio output circuit that drives an electroacoustic conversion element, comprising:
    a Class D amplifier including a plurality of segments connected in parallel;
    an amplifier structured to amplify a first audio signal and to generate a second audio signal;
    a pulse modulator structured to generate a pulse modulated signal that is modulated according to the second audio signal;
    a wiring that couples an output of the amplifier to an input of the pulse modulator;
    a level detector coupled to the wiring, structured to detect an amplitude of the second audio signal, and structured to generate a control signal that corresponds to the amplitude of the second audio signal; and
    a driver coupled directly to the level detector so as to receive the control signal and structured to selectively drive the plurality of segments of the Class D amplifier according to the control signal.

2. The audio output circuit according to claim 1, wherein the driver includes a plurality of sub-drivers that are respectively associated with the plurality of segments,
    wherein the sub-drivers are each configured to switch between an enable state in which a corresponding segment is driven and a disable state in which a driving operation for the corresponding segment is suspended,
    and wherein a number of sub-drivers to be set to the enable state is switchable according to the output of the level detector.

3. The audio output circuit according to claim 1, further comprising a volume circuit that changes the amplitude of the audio signal according to a volume setting value.

4. The audio output circuit according to claim 1, comprising two sets, each comprising the Class D amplifier and the driver, that operate in opposite polarity modes, so as to BTL (Bridged Transless) drive the electroacoustic conversion element.

5. An electronic device comprising:
    an electroacoustic conversion element;
    the audio output circuit according to claim 4;
    a first capacitor arranged such that one end thereof is connected to a positive electrode of the electroacoustic conversion element and the other end thereof is grounded;
    a second capacitor arranged such that one end thereof is connected to a negative electrode of the electroacoustic conversion element and the other end thereof is grounded;
    a first inductor arranged such that one end thereof is connected to the positive electrode of the electroacoustic conversion element and the other end thereof is connected to an output terminal of one of the two drivers of the audio output circuit; and
    a second inductor arranged such that one end thereof is connected to the negative electrode of the electroacoustic conversion element and the other end thereof is connected to an output terminal of the other one of the two drivers of the audio output circuit.

6. The audio output circuit according to claim 1, monolithically integrated on a single semiconductor substrate.

7. An electronic device comprising:
an electroacoustic conversion element having a negative terminal that is grounded;
the audio output circuit according to claim 1;
a first capacitor configured such that one end thereof is connected to a positive electrode of the electroacoustic conversion element and the other end thereof is grounded; and
a first inductor arranged such that one end thereof is connected to the positive electrode of the electroacoustic conversion element and the other end thereof is connected to an output terminal of the driver of the audio output circuit.

8. An audio output circuit that drives an electroacoustic conversion element, comprising:
a Class D amplifier including a plurality of segments connected in parallel;
a pulse modulator structured to generate a pulse modulated signal that is modulated according to an audio signal;
a level detector coupled directly to an output of the Class D amplifier or an input of the electroacoustic conversion element so as to receive a signal that corresponds to an output of the Class D amplifier, structured to detect an amplitude of the audio signal based on the received signal, and structured to generate a control signal that corresponds to the received signal; and
a driver structured to selectively drive the plurality of segments of the Class D amplifier according to the control signal.

9. The audio output circuit according to claim 8, wherein the level detector is directly coupled to the output of the Class D amplifier, and is structured to detect the amplitude of the audio signal based on the received signal.

10. The audio output circuit according to claim 9, wherein the level detector is structured to detect the amplitude of the output signal of the audio signal based on a duty ratio of the received signal.

11. The audio output circuit according to claim 9, wherein the level detector comprises a low-pass filter structured to smooth the received signal and the level detector is structured to detect the amplitude of the audio signal based on an output of the low-pass filter.

12. The audio output circuit according to claim 8, wherein the Class D amplifier has its output to be coupled to an input of the electroacoustic conversion element via an external low-pass filter,
and wherein the level detector is coupled to the input of the electroacoustic conversion element and is structured to detect the amplitude of the audio signal based on an input signal of the electroacoustic conversion element, and is structured to generate a control signal that corresponds to the input signal of the electroacoustic conversion element.

13. The audio output circuit according to claim 8, wherein the driver includes a plurality of sub-drivers that are respectively associated with the plurality of segments,
wherein the sub-drivers are each configured to switch between an enable state in which a corresponding segment is driven and a disable state in which a driving operation for the corresponding segment is suspended,
and wherein a number of sub-drivers to be set to the enable state is switchable according to the output of the level detector.

14. The audio output circuit according to claim 8, further comprising a volume circuit that changes the amplitude of the audio signal according to a volume setting value.

15. The audio output circuit according to claim 8, comprising two sets, each comprising the Class D amplifier and the driver, that operate in opposite polarity modes, so as to BTL (Bridged Transless) drive the electroacoustic conversion element.

16. The audio output circuit according to claim 8, monolithically integrated on a single semiconductor substrate.

17. An electronic device comprising:
an electroacoustic conversion element having a negative terminal that is grounded;
the audio output circuit according to claim 8;
a first capacitor configured such that one end thereof is connected to a positive electrode of the electroacoustic conversion element and the other end thereof is grounded; and
a first inductor arranged such that one end thereof is connected to the positive electrode of the electroacoustic conversion element and the other end thereof is connected to an output terminal of the driver of the audio output circuit.

* * * * *